(12) United States Patent
Van Den Berg

(10) Patent No.: US 6,359,829 B1
(45) Date of Patent: Mar. 19, 2002

(54) MAGNETIC MEMORY

(75) Inventor: Hugo Van Den Berg, Herzogenaurach (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/443,751

(22) Filed: Nov. 19, 1999

(30) Foreign Application Priority Data

Nov. 19, 1998 (DE) .......................................... 198 53 447

(51) Int. Cl.[7] ................................................. G11C 8/02
(52) U.S. Cl. ........................ 365/232; 365/173; 365/210; 365/213; 365/189.07
(58) Field of Search ................................ 365/232, 173, 365/210, 213, 189.07

(56) References Cited

U.S. PATENT DOCUMENTS

| | | | |
|---|---|---|---|
| 3,982,233 A | | 9/1976 | Crookshanks .............. 340/174 |
| 5,173,873 A | | 12/1992 | Wu et al. .................... 365/173 |
| 5,477,482 A | | 12/1995 | Prinz .......................... 365/129 |
| 5,640,343 A | * | 6/1997 | Gallagher et al. .......... 365/171 |
| 5,699,293 A | * | 12/1997 | Tehrani et al. .............. 365/158 |
| 5,936,882 A | * | 8/1999 | Dunn .......................... 365/158 |
| 6,055,178 A | * | 4/2000 | Naji ............................ 365/158 |
| 6,055,179 A | * | 4/2000 | Koganei et al. ............ 365/158 |
| 6,111,781 A | | 8/2000 | Naji ............................ 365/158 |
| 6,191,972 B1 | * | 2/2001 | Miura et al. ................ 365/171 |

FOREIGN PATENT DOCUMENTS

| | | |
|---|---|---|
| EP | 0450912 A2 | 10/1991 |
| EP | 0 613 148 A2 | 8/1994 |
| EP | 0681338 A1 | 11/1995 |
| WO | WO 99/14760 | 3/1999 |

OTHER PUBLICATIONS

"Perpendicular Hot Electron Spin–Valve Effect in a New Magnetic Field Sensor: The Spin–Valve Transistor" (Monsma et al.), in Physical Review Letters, vol. 74, No. 26, dated Jun. 26, 1995, pp. 5260–5263.

* cited by examiner

Primary Examiner—Richard Elms
Assistant Examiner—Tuan T. Nguyen
(74) Attorney, Agent, or Firm—Herbert L. Lerner; Laurence A. Greenberg; Werner H. Stemer

(57) ABSTRACT

A magnetic memory of the random access type (MRAM) contains a memory cell array formed of a multiplicity of memory cells. The memory cells are disposed in the form of a matrix at the points of intersection of word lines and sense lines and the logical data contents of which are defined by a magnetic state. The magnetic memory further contains an addressing circuit allocated to the word lines. The address circuit applies a read voltage to the word line of one or more selected memory cells, the data contents of which are to be read out. An evaluation circuit is provided that is allocated to the sense lines and receives and evaluates a sense signal corresponding to the data contents of the selected memory cell or memory cells. The evaluation circuit has a comparator circuit receiving a reference signal supplied by a reference element that is compared with the sense signal of the memory cell or memory cells to be read out.

29 Claims, 11 Drawing Sheets

MAGNETIC MEMORY

BACKGROUND OF THE INVENTION

Field of the Invention

The invention relates to a magnetic memory of the random access type (MRAM) containing a memory cell array consisting of a multiplicity of memory cells which are disposed in the form of a matrix at the points of intersection of word lines and sense lines and the logical data contents of which are defined by a magnetic state. The magnetic memory further contains an addressing circuit allocated to the word lines, by which a voltage is applied to the word line of one or more selected memory cells, the data contents of which are to be read out. The magnetic memory also has an evaluation circuit allocated to the sense lines, by which a signal corresponding to the data contents of the selected memory cell or memory cells is acquired and evaluated, respectively.

In such magnetic memories organized as a matrix, the data information is contained in an information carrier layer of the magnetic memory cells disposed at the points of intersection of the word lines and the sense lines in the form of a direction of magnetization. To read out a memory cell, a read voltage is applied either to the sense line or to the word line (always the word line in the text which follows) and via the word line or sense line the signal determined by the impedance of the memory cell which reflects the memory state is evaluated by an associated word line or sense line amplifier circuit.

In this configuration, the relative difference in the impedance of the memory cell depending on the information content ("one" or "zero") is typically approximately 20% which represents a comparatively low value. To make matters worse for determining the difference in impedance all other memory cells form parallel paths to the memory cell to be read out, thus forming a large parasitic impedance, which weakens the effect of the difference in impedance of the memory cell to be read out by orders of magnitude even with only 100 elements per word line, which has a disadvantageous effect on the signal picked up via the sense lines (sense signal) which is analyzed by a subsequent evaluation circuit.

The manufacture of magnetic memories is affected by fluctuations in the absolute impedances of the memory cells within a batch, a wafer and also within the memory cell array of an individual magnetic memory. The consequence of this is that absolute impedance measurements do not represent a useful starting point for determining the memory state of the memory cell to be read out.

One procedure for determining the memory content of a memory cell that has been known hitherto is now described. The memory cell is read out by activating the associated word lines and sense lines and applying a read voltage to the memory cell and evaluating the signal of the memory cell. The measurement signal thus obtained is temporarily stored, for example capacitively. Following this, a known value ("Tone" or "zero") is newly written into the memory cell, read out again and the new measurement signal is compared with the measurement signal temporarily stored in order to be able to determine by this the actual memory state. The disadvantageous factor is here obviously that the procedure involves a number of steps.

In a further previously known approach, magnetic reference layers located within the memory cell are used. In this case, a distinction can again be made between permanent and variable magnetic reference layers. Since in the case of permanent magnetic reference layers the same problems with the fluctuations of the absolute impedances as already described above occur they will not be considered in greater detail here. In order to read out a memory cell, magnetic reference layers with a variable magnetic orientation can be magnetically orientated in a defined direction (reference direction) by a current through the word line or sense line. In this case, the change in direction of the orientation, and thus of the absolute impedance, is evaluated instead of the absolute impedance value. The direction of magnetization of the information carrier layer, which can be equated with the data contents, is retained in this case and the reference layer that is magnetized relatively softly is remagnetized. It is also possible to use a memory in which the reference layer is the magnetically harder layer and the information carrier layer is switched over.

All previously known methods and memories have the disadvantage that the information of the memory cell is read out by successively occurring processes resulting in a relatively great time expenditure.

SUMMARY OF THE INVENTION

It is accordingly an object of the invention to provide a magnetic memory which overcome the above-mentioned disadvantages of the prior art devices and methods of this general type, in which there is no loss of time due to successively occurring processes or method-associated rewriting of the information and which provides for data processing which is independent of fluctuations in the absolute impedances of the memory cells due to manufacture.

With the foregoing and other objects in view there is provided, in accordance with the invention, a random access type magnetic memory (MRAM), including:

word lines;

sense lines;

a memory cell array containing a multiplicity of memory cells disposed in a matrix at points of intersection of the word lines and the sense lines and having logical data contents being defined by a magnetic state;

an addressing circuit connected to the word lines for applying a read voltage to a word line of a selected memory cell in which the logical data contents are to be read out as a sense signal on one of the sense lines;

a reference element outputting a reference signal; and an evaluation circuit connected to the sense lines and having a comparator circuit receiving the sense signal and the reference signal supplied by the reference element and compares the reference signal with the sense signal generated from the selected memory cell being read out.

According to the invention, it is provided that the evaluation circuit has a comparator circuit by which a reference signal supplied by a reference element is compared with the sense signal of the selected memory cell or memory cells. The invention proposes to render the read-out process independent of the influences of the fluctuation of the absolute impedances of the wafer or of the batch by providing a reference element formed on the memory chip. This makes it possible to read out the information of the memory cell without the great fluctuations of the absolute impedances having an effect. This is achieved by forming a difference signal in the comparator circuit with the sense signal of the memory cell and the reference signal of the reference cell.

In this configuration, the comparator circuit is suitably formed by a differential amplifier which is associated with a resistor, one end of which is connected to one input and the other end of which is connected to the output of the differential amplifier and resistors are connected in series with the inputs of the differential amplifier.

In an advantageous development of the invention, the word lines and sense lines can be individually connected to ground by grounding switches. The advantage resulting from this is that the multiplicity of parasitic elements formed by the totality of the memory cells is distinctly reduced if the word lines and sense lines not needed for acquiring the signal are grounded.

The reference element can be advantageously constructed in such a manner that the electrical and magnetic characteristics, respectively, are matched to the characteristics of the memory cell(s) and, if necessary, is adjusted to those of the memory cells by varying the same characteristics and, in addition, is disposed outside the memory cell array. The reference element is advantageously connected directly to the reference amplifier circuit which processes the signal of the reference cell to become the reference signal.

If the magnetic and electrical characteristics, respectively, of the memory cells within a memory cell array fluctuate too much, it may be of advantage in a further development of the invention to divide the memory cell array into a number of different cell areas of contiguous memory cells having approximately the same electrical and magnetic characteristics, respectively, and to allocate a separate reference element or reference signal, respectively, to the cell areas so that the signal quality of the difference signal of the sense signal of the memory cell to be read out and of the reference element is retained.

Advantageously, the reference element can be constructed as a memory cell located within the memory cell array in order to have as far as possible the same magnetic and electrical characteristics, respectively, as the memory cell(s) to be read out. In consequence, the sense line of the reference element is advantageously connected to the reference amplifier circuit. The reference element, which can thus be freely selected and is constructed to be spatially variable, is suitably selected in such a manner that it is located next to the memory element to be read out.

In an especially preferred embodiment of the invention, the reference element is not located on the same word line and also not on the same sense line, that is to say on adjacent word and/or sense lines of the selected memory cell(s). In this case, the word line of the reference element can be suitably connected to the comparator circuit.

According to a further preferred embodiment of the invention, a number of reference elements adjacent to the memory cell to be read out are provided, the word lines of which, which are not coincident with that of the memory cell to be read out, are jointly connected to the comparator circuit. In consequence, it can be provided in a further embodiment that different voltage levels from the word line of the memory cell to be read out are applied to the sense lines of the reference elements.

The memory cells of the memory cell array are suitably constructed as now stated. On a substrate, word lines are deposited on which layers of a first magnetic material, of a magnetic tunnel barrier and of a second magnetic material are deposited, on which the sense lines are deposited crossing the word lines. The conductance of the layer system is proportional to the energy level densities on the Fermi levels of the two metallic electrodes formed by layers of the first and second magnetic material. Due to the fact that the electrodes are magnetic, the current through the tunnel barrier is split into two spin channels, the spin direction of these channels being dependent on the magnetization of the magnetic layer of different type which is magnetically harder than the other one. In this configuration, the tunnel current, in each case one of the spin channels, is proportional to the energy level densities on both sides of the barrier for this spin direction. If the direction of magnetization of the softer layer is changed with respect to the harder one, the energy level densities of the softer layer will simultaneously change for both spin channels. As a consequence, the total current through the barrier changes.

In an equally suitable manner, the memory cells can also be formed by layer sequences of magnetic layers of a first type, decoupling layers, magnetic layers of a second type and again decoupling layers and a multiple of this configuration, which layer sequences are disposed between intersecting sense lines and word lines. By rotating the direction of magnetization, for example of the magnet layer of the first type with respect to the magnetic layer of the second type, the resistance of the stack of layer sequences changes. The difference in resistance between a parallel magnetization of the magnetic layers of the first and second type and an anti-parallel alignment can thus represent the bit states via a difference in resistance.

Other features which are considered as characteristic for the invention are set forth in the appended claims.

Although the invention is illustrated and described herein as embodied in a magnetic memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
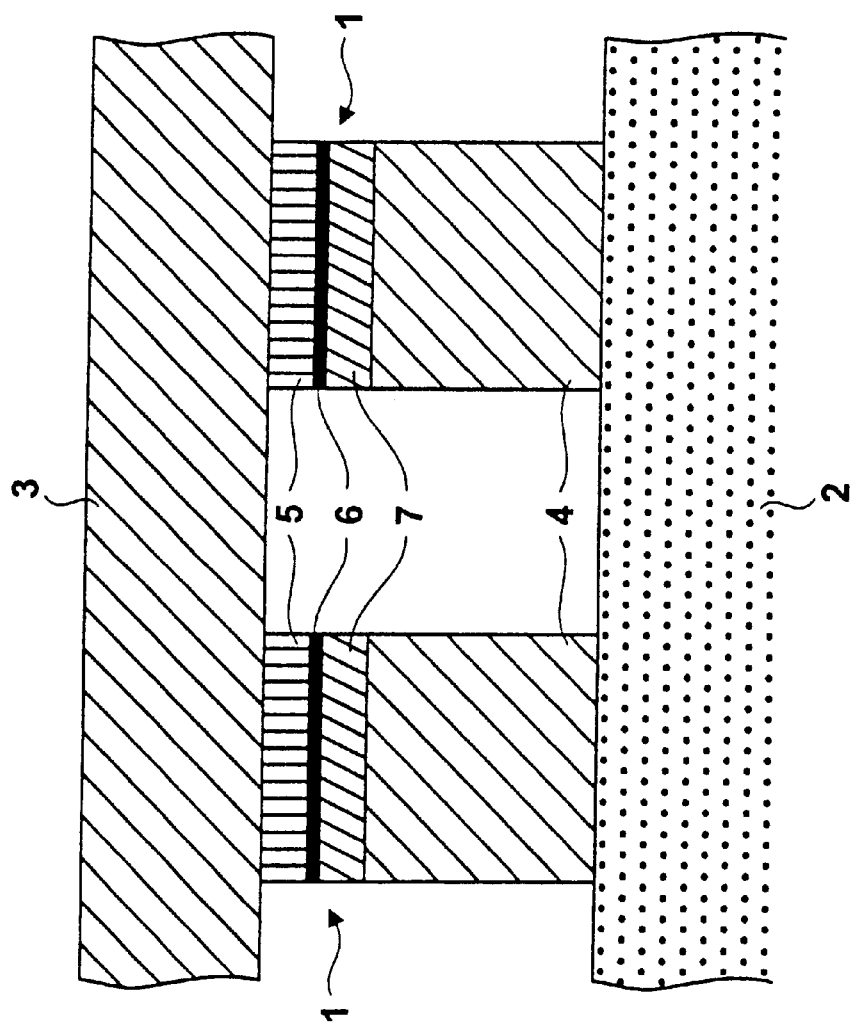
FIG. 1 is a diagrammatic, sectional view through a magnetic memory with intersecting sense lines and word lines according to the invention.

In all the figures of the drawing, sub-features and integral parts that correspond to one another bear the same reference symbol in each case. Referring now to the figures of the drawing in detail and first, particularly, to FIG. 1 thereof, there is shown a section through a magnetic memory containing memory cells 1. On a substrate 2, sense lines 4 are deposited on which word lines 3, disposed perpendicularly to the sense lines 4 over these are provided. At points of intersection between the word lines and sense lines 3 and 4, a sequence of layers of a first layer of a magnetic material 7, a tunnel barrier layer 6 and a second magnetic layer 5 is disposed which layers form the memory cells 1. The two magnetic layers 5 and 7 are used, on the one hand, for storing information and, on the other hand, as a reference layer. In the text which follows, it is assumed that the magnetic layer 7 is the information carrier layer and the magnetic layer 5 is the reference layer which consists of a material which is magnetically softer than the information carrier layer 7. For the purpose of writing or reading the memory cell 1, a voltage is applied to the corresponding word lines 3 and the associated sense line 4 is grounded at least virtually. In this configuration, the direction of magnetization of the reference layer 5 can be selectively changed in order to determine the magnetic state of the information carrier layer 7 in order to read out the memory cell.

The conductance of the layer system is proportional to the energy level densities at the Fermi levels of the two metallic electrodes constructed by the layers 5 and 7 of the second and first magnetic material, which electrodes are connected, on the one hand, to the word line 3 and, on the other hand, to the sense line 4. Due to the fact that the electrodes are magnetic, the current through the tunnel barrier layer 6 is split into two spin channels. The spin direction of the channels is dependent on the magnetization of the magnetic layers 5, 7, where the magnetic layers 5, 7 are of different types in which one layer is magnetically harder than the other one. In this configuration, the tunnel current, in each case one of the spin channels, is proportional to the energy level densities on both sides of the barrier for this spin direction. If the direction of magnetization of the softer layer is changed with respect to the harder one, the energy level densities of the softer layer simultaneously change for both spin channels. In consequence, the total current through the barrier changes.

Figure 2:
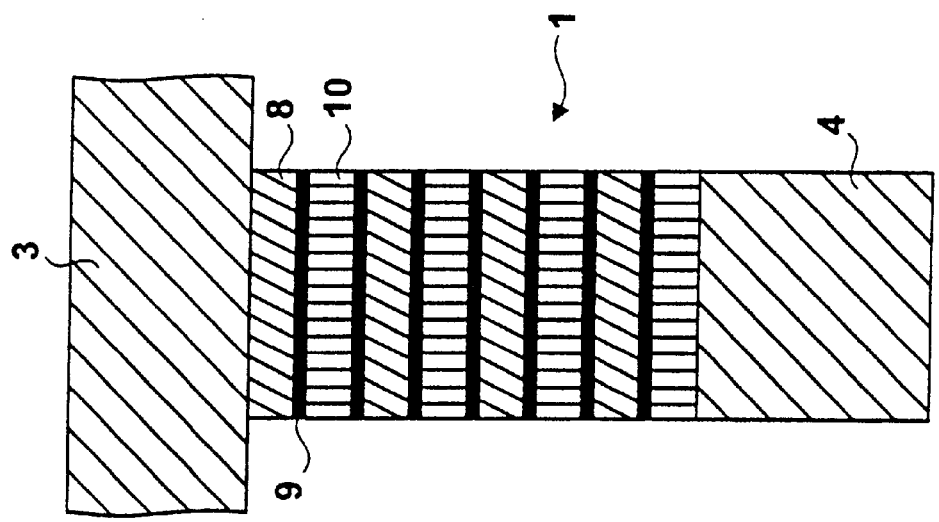
FIG. 2 is a sectional view through a CPP element.

FIG. 2 shows a cross section through a further embodiment of the magnetic memory cell 1 in the form of a stack of layer sequences which is composed of magnetic layers of a first type 8, decoupling layers 9, magnetic layers of a second type 10 and again the decoupling layers 8, and a multiple of this configuration. The stack of layer sequences which forms the magnetic memory cell 1 is disposed between intersecting sense lines 4 and word lines 3 which extend perpendicularly to the sense lines 4.

Figure 3:
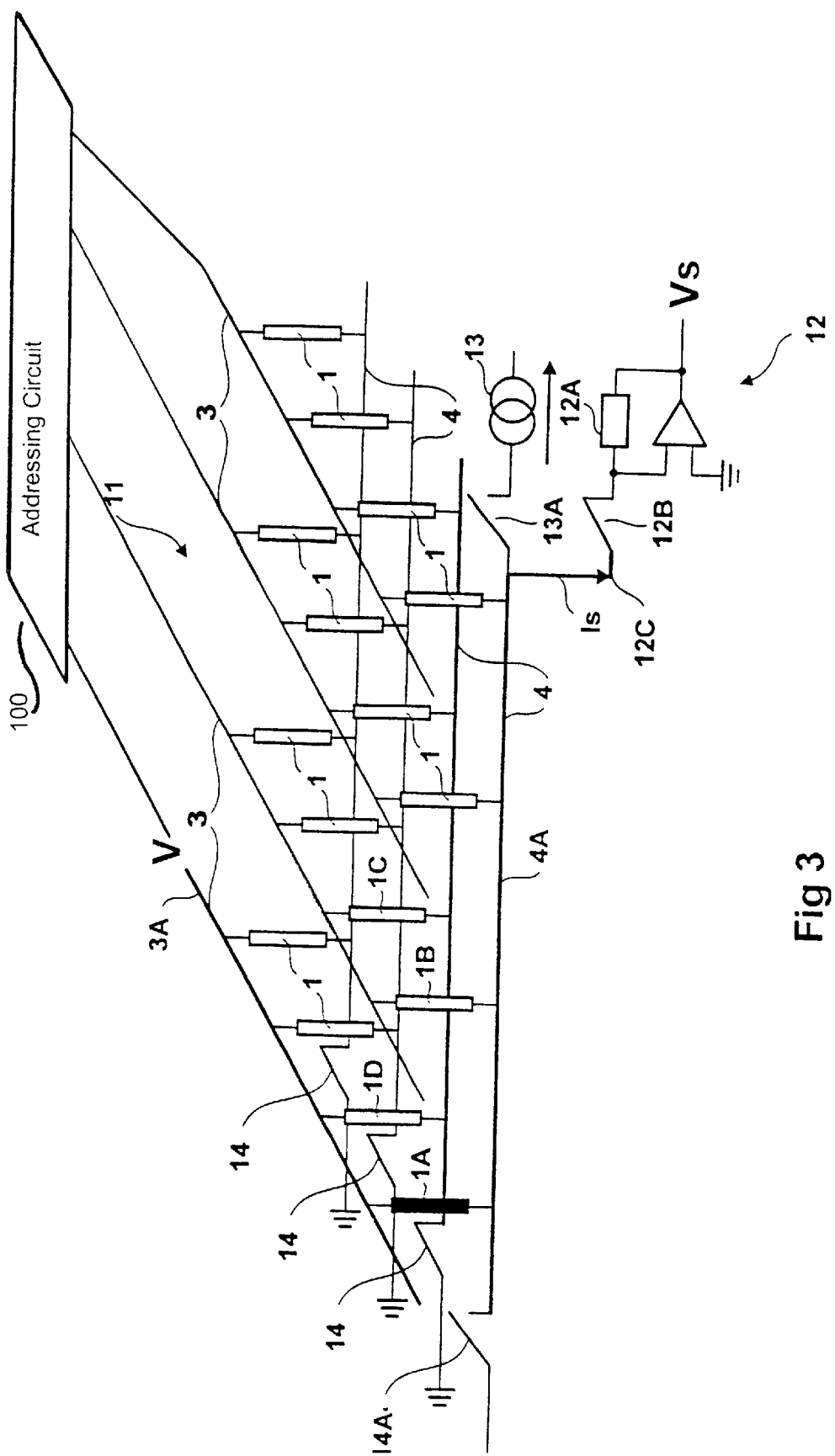
FIG. 3 is a block diagram of the magnetic memory with a basic circuit diagram of an evaluation circuit.

The diagrammatic circuit diagram of a matrix-shaped magnetic memory, shown in FIG. 3, shows the memory cells 1 disposed at the points of intersection of the word lines 3 (M in number) and of the sense lines 4 (N in number). The sense lines 4 are in each case connected to write current sources 13 via write current switches 13A and to sense line amplifier circuits 12 via read switches 12B. In order to read out the memory cells 1, a voltage can be applied to the word lines 3 via an addressing circuit 100. If, for example, memory cell 1A, which is immediately surrounded by memory cells 1B, 1C and 1D, is to be read out, a read voltage V is applied to the word line 3A, the write current switch 13A is opened and the read switch 12B is closed. The occurring signal current Is is evaluated via sense line 4A of the memory cell 1A to be read out, by use of the sense line amplifier circuit 12, the input 12C of which is virtually grounded. In this configuration, a current/voltage converter 12A is used as a converter of the signal current Is which, due to the impedance difference $\Delta R/R$ of the memory cell 1A in its two information states ("one" and "zero"), carries an information item, into the signal $\Delta V$ to be detected. The disadvantage is that the other memory cells 1 form parallel paths to the memory cell 1A to be read out. If the input 12C were not virtually grounded but coupled via an impedance, the parallel paths of the other memory cells 1 would add up in total to form the parasitic total impedance $Z_p$ which is calculated as $$Z_P = \frac{(N + M - 1)}{(M - 1)(N - 1)} R \approx \frac{1}{M - 1} R; \quad \text{for } N \gg M$$

(where R represents the impedance of the individual memory cell 1 in this case). For the signal $\Delta V$ to be detected, the signal amplitude would have to be reduced by at least orders of magnitude (approximately factor $10^4$) compared with an individual isolated memory cell, according to $$\Delta V = \frac{1}{1 + \frac{M-1}{M} \cdot \frac{\Delta R}{R}} \cdot \frac{\frac{\Delta R}{R}}{M} \cdot \frac{R \cdot I_{READ}}{M} \leq \frac{\frac{\Delta R}{R}}{M} \cdot \frac{R \cdot I_{READ}}{M}$$

assuming a number of only about 100 elements per word line. The power needed for reprogramming cell 1A for the read process would increase even more with M, according to $$E_{READ} = \left(\frac{M \Delta V}{\frac{\Delta R}{R}}\right)^2 \cdot \frac{M}{R} \cdot \Delta t$$

so that approximately 5 nJ will be dissipated at the memory cells for each read process with a pulse duration of 10 ns, about 100 word lines, $R=10^5 \Omega$, $\Delta R/R=20\%$, $\Delta V=50$ mV, which would be too high by orders of magnitude for this application.

The number of significant elements which form the network of parasitic impedances and thus the total parasitic impedance can be distinctly reduced by virtually grounding the sense line 4A of the memory cell 1A to be read out, and grounding via grounding switches 14 all sense lines 4 not needed. $E_{READ}$ is now only proportional to M instead of $M^3$ in this case.

Figure 4:
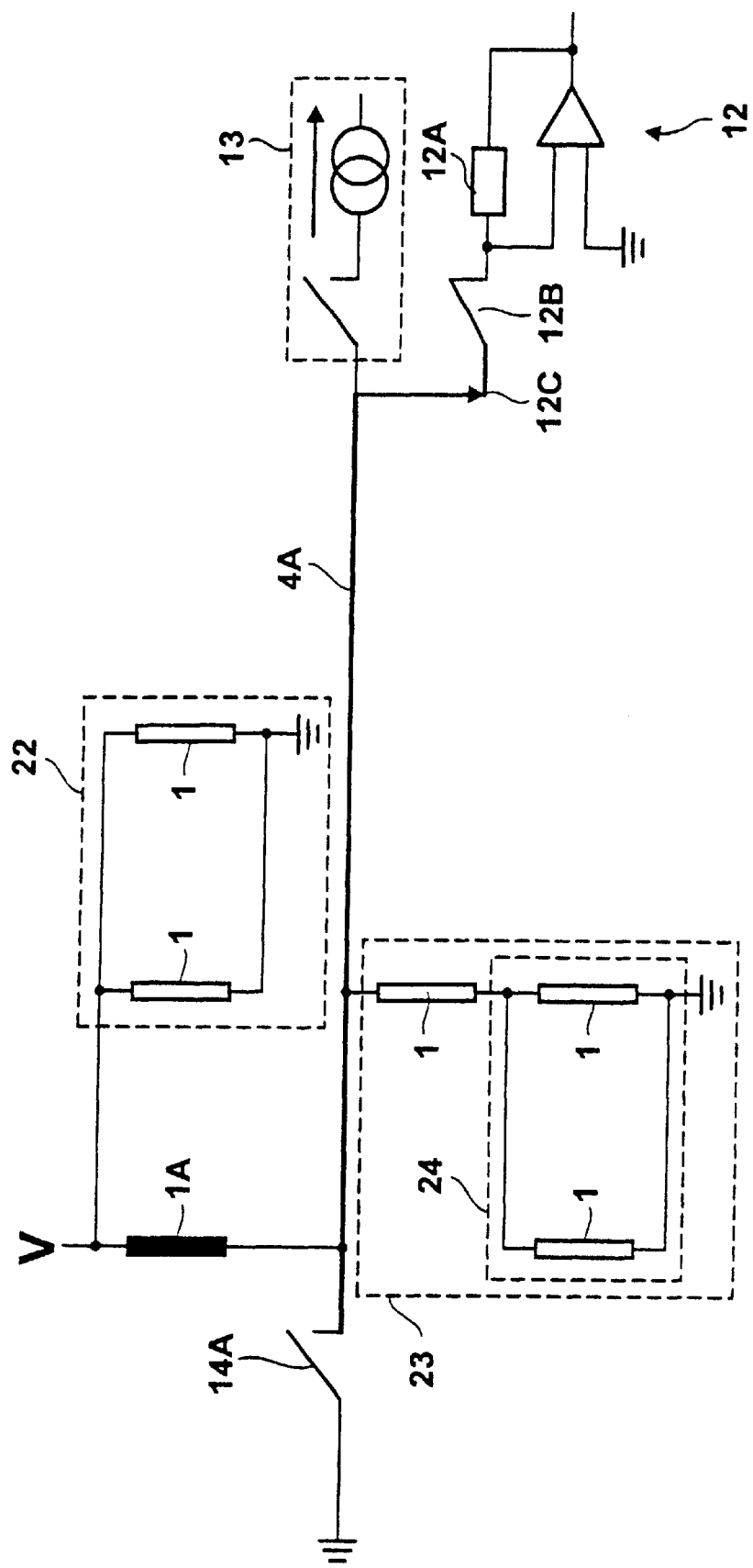
FIG. 4 is a circuit diagram of elements that are of significance to forming a signal.

FIG. 4 shows a simplified diagrammatic circuit diagram of the parasitic network with grounding via the grounding switches 14 of the sense lines 4 that are not needed. The grounding switch 14A of the sense line 4A is open. The resulting parasitic networks 22 and 23 of parallel and series circuits are composed as now described. The network 22 consists of a parallel circuit of M−1 memory cell impedances of word line 3A (two elements shown), the entire network 23 occurs (N−1) times, the subnetwork 24 in each case consisting of a parallel circuit of M−1 memory cell impedances (two elements shown).

Input 12C to the sense line amplifier circuit 12 is virtually grounded. For this reason, the output signal ΔV is essentially determined by the impedance $R_u$ of the current/voltage converter 12A and the impedance $R_s$ and its change $\Delta R_s$ of the memory cell 1A to be read out, according to $$\Delta V = \frac{R_U}{R_S} \cdot \frac{\Delta R_S}{R_S} \cdot V.$$

Due to the fluctuation of the absolute impedances $R_s$ of the memory cells, which are due to the manufacturing process of the magnetic memory, absolute determinations of the impedance cannot be useful for determining the memory state of the memory cells 1A to be read out.

One method for determining the memory state of the memory cell 1A to be read out can be done by the now described procedure. The data state is determined by applying a read voltage V to the word line 3A, measuring the impedance of the memory cell 1A to be read out, temporarily storing the result, reprogramming the memory cell 1A to a defined memory state and comparing the result, obtained after again measuring the impedance of the memory cell 1A, with the previous result. However, this method has the disadvantage that the information must be written in again after the read out and the read process is split into individual steps that have to be processed successively. Rewriting the information is not required if the memory cell consists of a so-called hard/soft system in which the magnetic reference layer 5 used is magnetically softer than the information carrier layer 7 since the direction of magnetization of the magnetic reference layer 7 is changed in this case.

Figure 5:
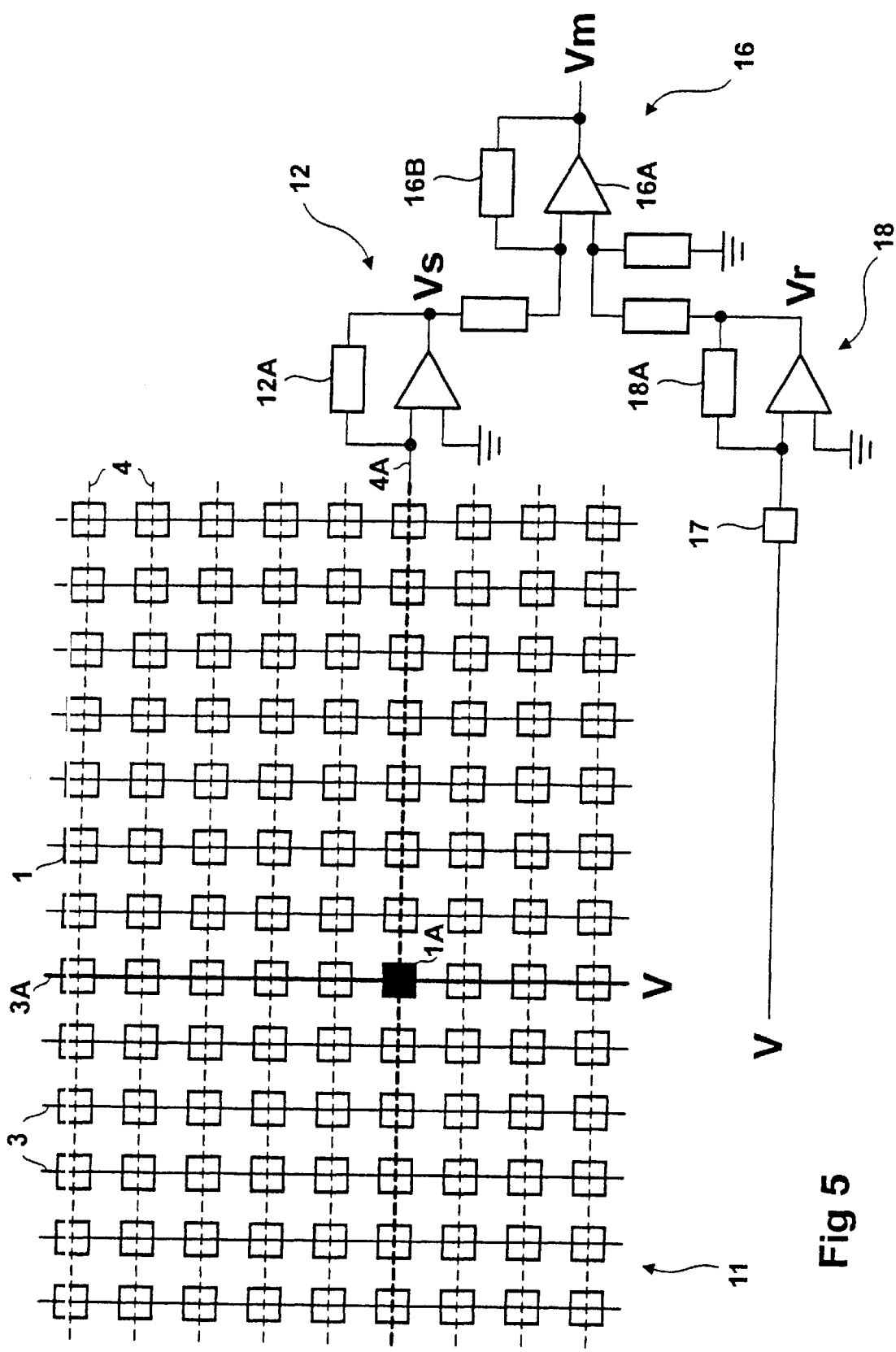
FIG. 5 is a circuit diagram of the magnetic memory with the evaluation circuit containing a reference element outside a memory cell array.

FIG. 5 shows a diagrammatic circuit diagram of the magnetic memory containing an additional reference element 17 outside a memory cell array 11, and an associated reference amplifier circuit 18 and a comparator circuit 16 which compares the signals of the reference amplifier circuit 18 and of the sense line amplifier circuit 12 with one another. The electrical and magnetic characteristics, respectively, of the reference element 17 are matched with the electrical and magnetic characteristics, respectively of the memory cell(s) 1. This can be done by changing the reference element itself (for example the area of the element) or by adapting an associated network of resistors or an impedance 18A of the reference amplifier circuit 18. For a read-out process, a read voltage V is applied via word line 3A to the memory cell 1A to be read out. The signal current occurring is picked up via the sense line 4A and evaluated by the sense line amplifier circuit 12. A sense signal Vs obtained in this manner is evaluated by a reference signal Vr of the reference amplifier circuit 18 by the comparator circuit 16 which supplies a difference signal of Vs and Vr, called measurement signal Vm in the text which follows. The basic concept of the circuit is that the characteristics of the memory cells 1 are eliminated during the evaluation by the comparator circuit 16 by forming the difference between its sense signal Vs and a signal which corresponds to the electrical and magnetic characteristics, respectively, of the memory cell so that it is only the state of magnetization of the memory cell which determines the result of the impedance measurement. In the ideal case, this eliminates the interfering influences of the manufacture-associated fluctuations of the absolute impedances of the memory cells from batch to batch or even between complete memories within a wafer.

Figure 6:
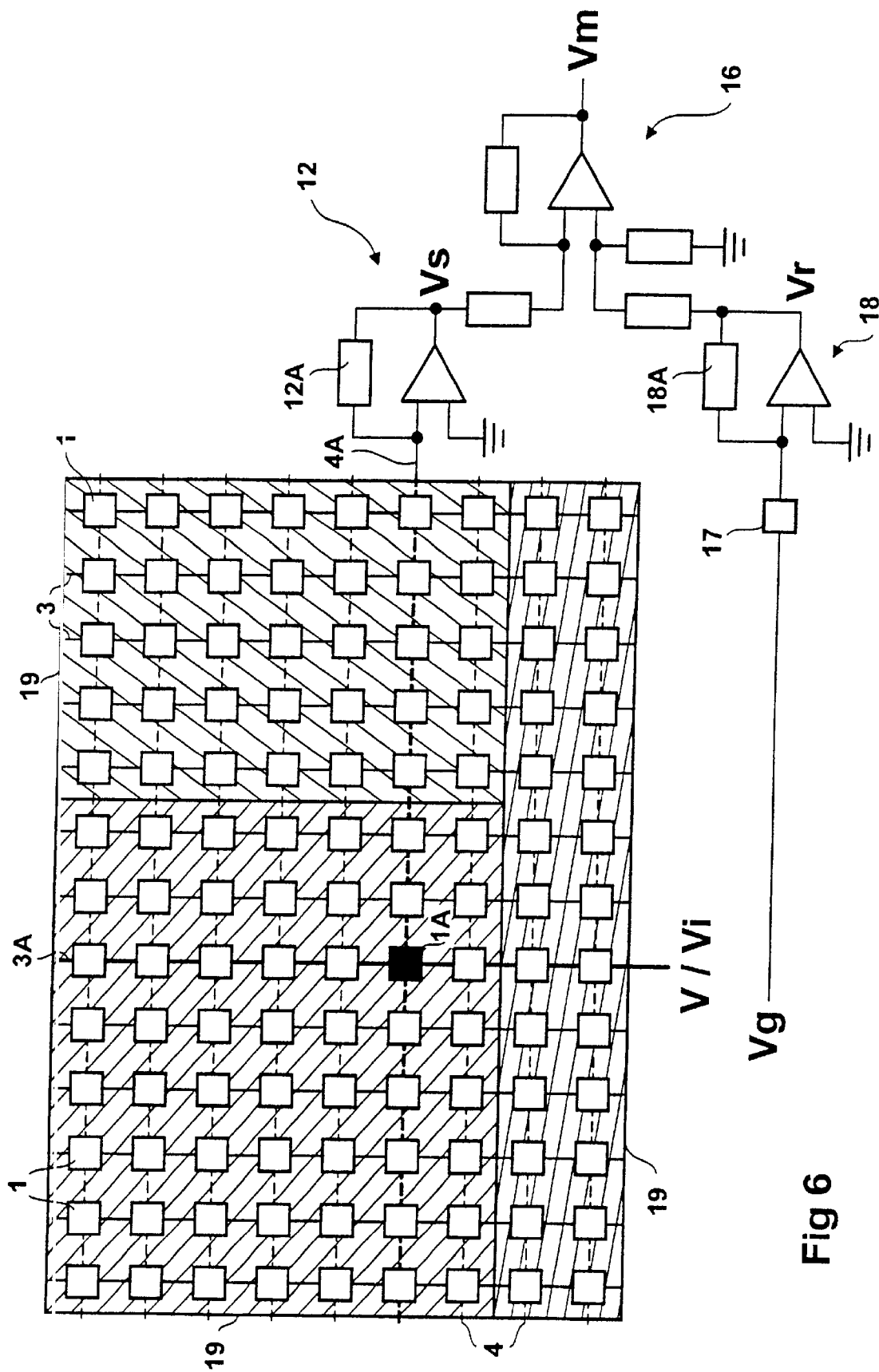
FIG. 6 is a circuit diagram of the magnetic memory with the evaluation circuit containing the reference element outside the memory cell array containing magnetic memory cells combined in arrays.

FIG. 6 shows another embodiment of the invention. The memory cells of similar impedance characteristics are combined to form cell areas 19. To these cell areas 19, separate read voltages Vi are allocated, or the impedances 12A of the sense line amplifier circuits 12 and/or the impedance 18A associated with the reference amplifier circuit 18 are matched to these cell areas or different voltages Vg are applied to the reference element 17 so that the measurement signal Vm is approximately free of interfering influences of the electrical and magnetic characteristics, respectively, of the memory cell(s) 1. Suitably, the reference amplifier circuit 18 with the associated reference element 17 can also be present several times for this purpose. For defining the cell areas 19 and adjusting the reference characteristics, the magnetic memory must be measured. There are limits to the spread of the magnetic memory which can be handled.

Figure 7:
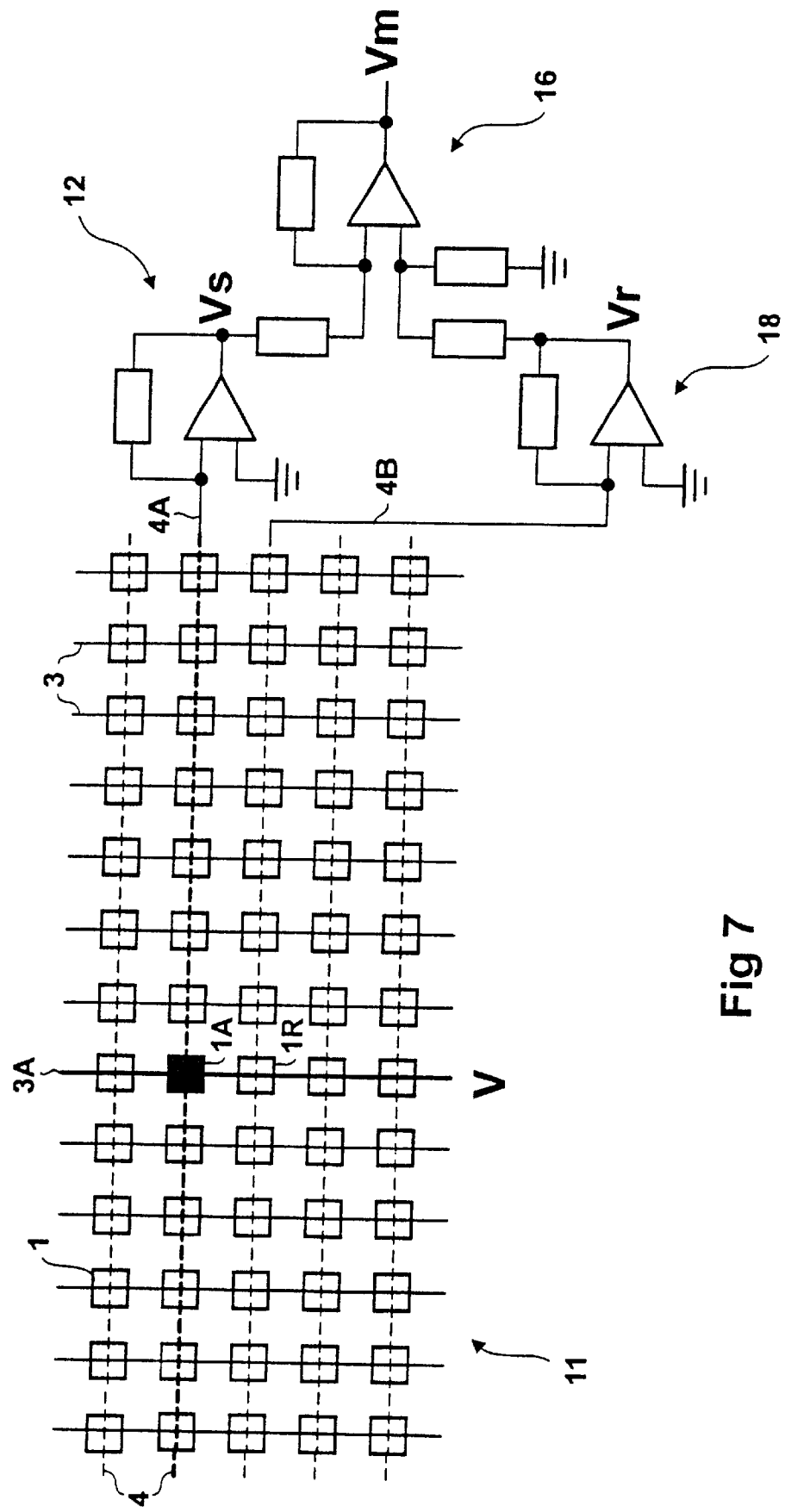
FIG. 7 is a circuit diagram of the magnetic memory with the evaluation circuit containing the reference element within the memory cell array with acquisition of the reference signal via a sense line.

FIG. 7 shows a further modification of the invention where it is provided that a reference element is formed by a reference cell 1R located inside the memory cell array 11. The signal of the reference cell 1R, which in this configuration is suitably formed by the memory cell 1R adjacent to the memory cell 1A to be read out, is supplied to the reference amplifier circuit 18 via the sense line 4B. The read voltage V is applied to the reference cell 1R by the word line 3A of the memory cell 1A to be read out. During the comparison measurement of the signals Vs and Vr, the problem occurs that the output signal Vm of the comparator circuit 16 is zero when the memory cell 1A to be read out and the reference cell 1R carry the same memory state, that is to say it is not possible to allocate an unambiguous memory state of the memory cell 1A to the voltage Vm.

Figure 8:
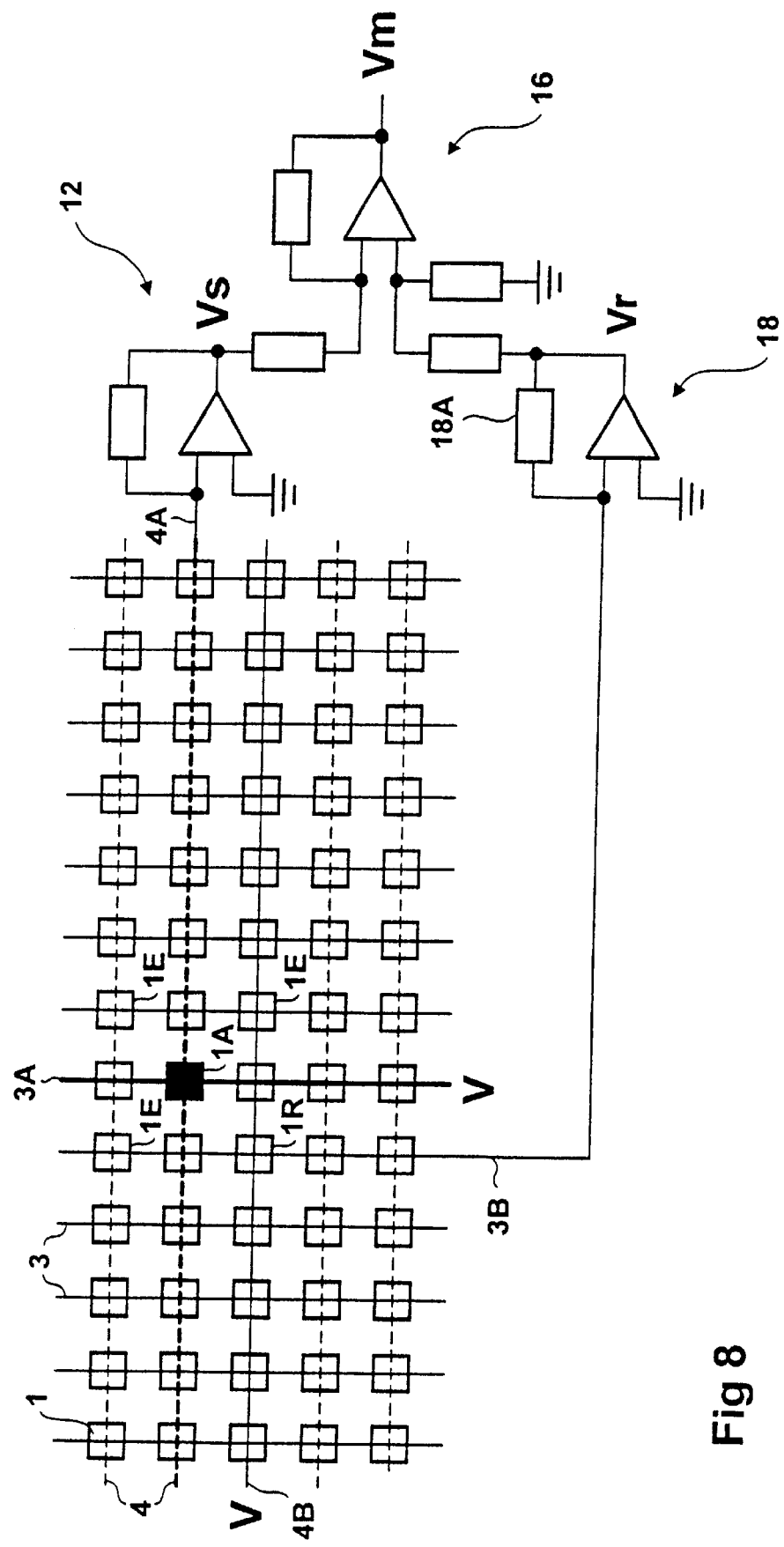
FIG. 8 is a circuit diagram of the magnetic memory with the evaluation circuit containing the reference element within the memory cell array with acquisition of the reference signal via a word line.

In FIG. 8, the signal of the reference cell 1R, which is now no longer located on the same word line 3A of the memory cell 1A to be read out, is supplied to the reference amplifier circuit 18 via word line 3B in a preferred embodiment of the invention. The memory cells 1E represent equivalent cells to reference cell 1R in this case. To determine the memory state, the read voltage V is applied to the sense line 4B, on which the reference cell 1R is located, and the word line 3A of the memory cell 1A to be read out.

Figure 9:
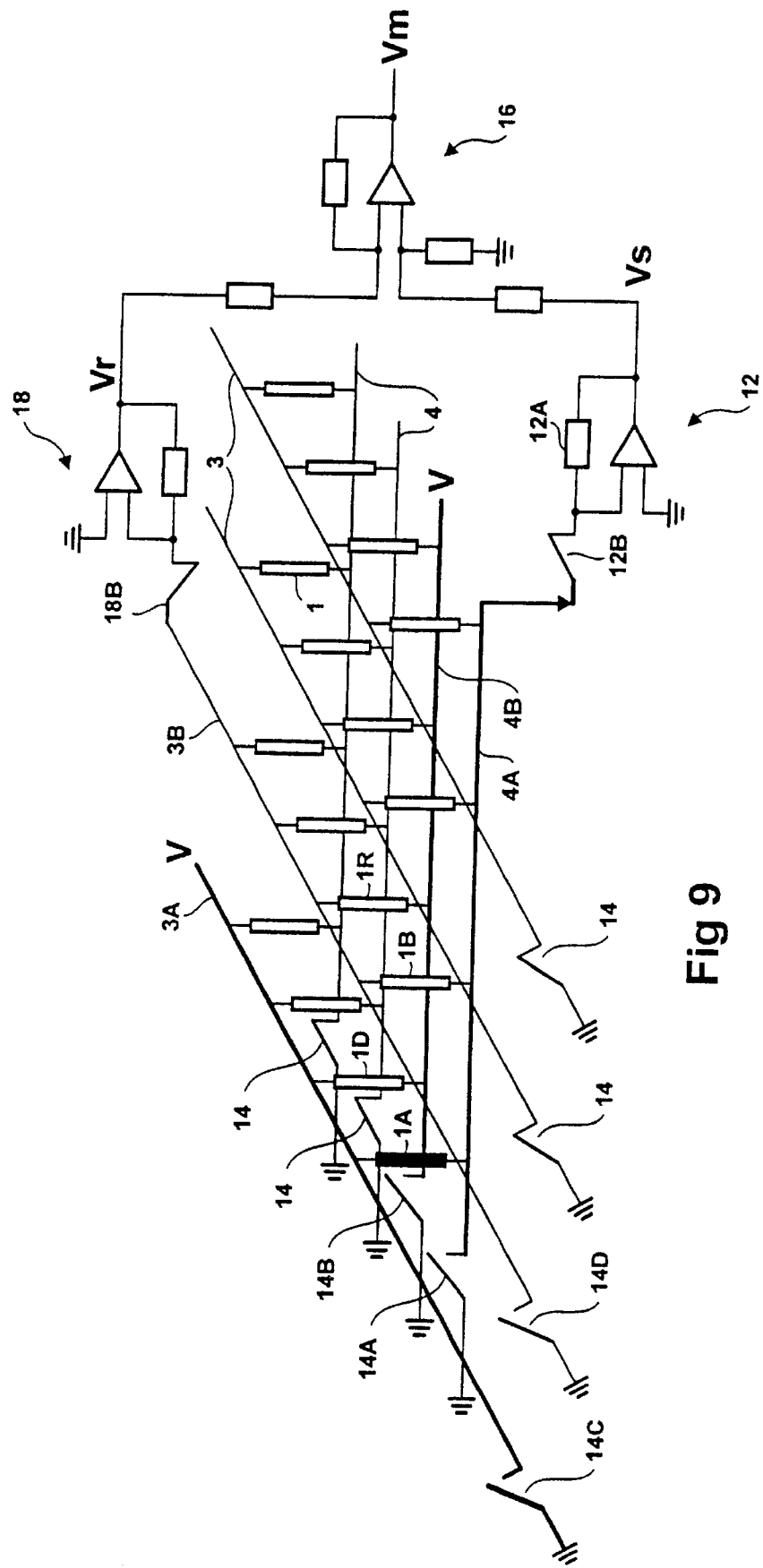
FIG. 9 is a block diagram of the magnetic memory with the basic circuit diagram of the evaluation circuit that acquires the reference signal via a word line.

FIG. 9 shows a diagrammatic circuit diagram of the magnetic memory containing the integrated reference element 1R. The memory cells 1D, 1B and 1R are immediate neighbors of the memory cell 1A to be read out. All sense lines and word lines 4 and 3 not involved in acquiring a measurement are grounded via the closed grounding switches 14 (in contrast switches 14A to 14D are open). The read voltage V is applied to the word line 3A and the sense line 4B. The signal of the memory cell 1A to be read out is conducted via the sense line 4A to the sense line amplifier circuit 12 which is connected via the read switch 12B and provides the sense signal Vs at the output. The signal of the reference cell 1R is conducted to the reference amplifier circuit 18 via the word line 3B and the reference switch 18B and is processed to form the reference signal Vr. The comparator circuit 16 further processes the two signals Vr and Vs to form the measurement signal Vm.

The memory cell 1B on the sense line 4A of the memory cell 1A to be read out is virtually grounded in both directions through the inputs of the reference amplifier circuit 18 and of the sense line amplifier circuit 12 and, therefore, does not disadvantageously contribute to the signal of the reference element 1R. The memory cell 1D is connected in both directions to the read voltage V on word line 3A and to sense line 4B and thus does not provide a disadvantageous contribution to the measurement signal Vm.

Figure 10:
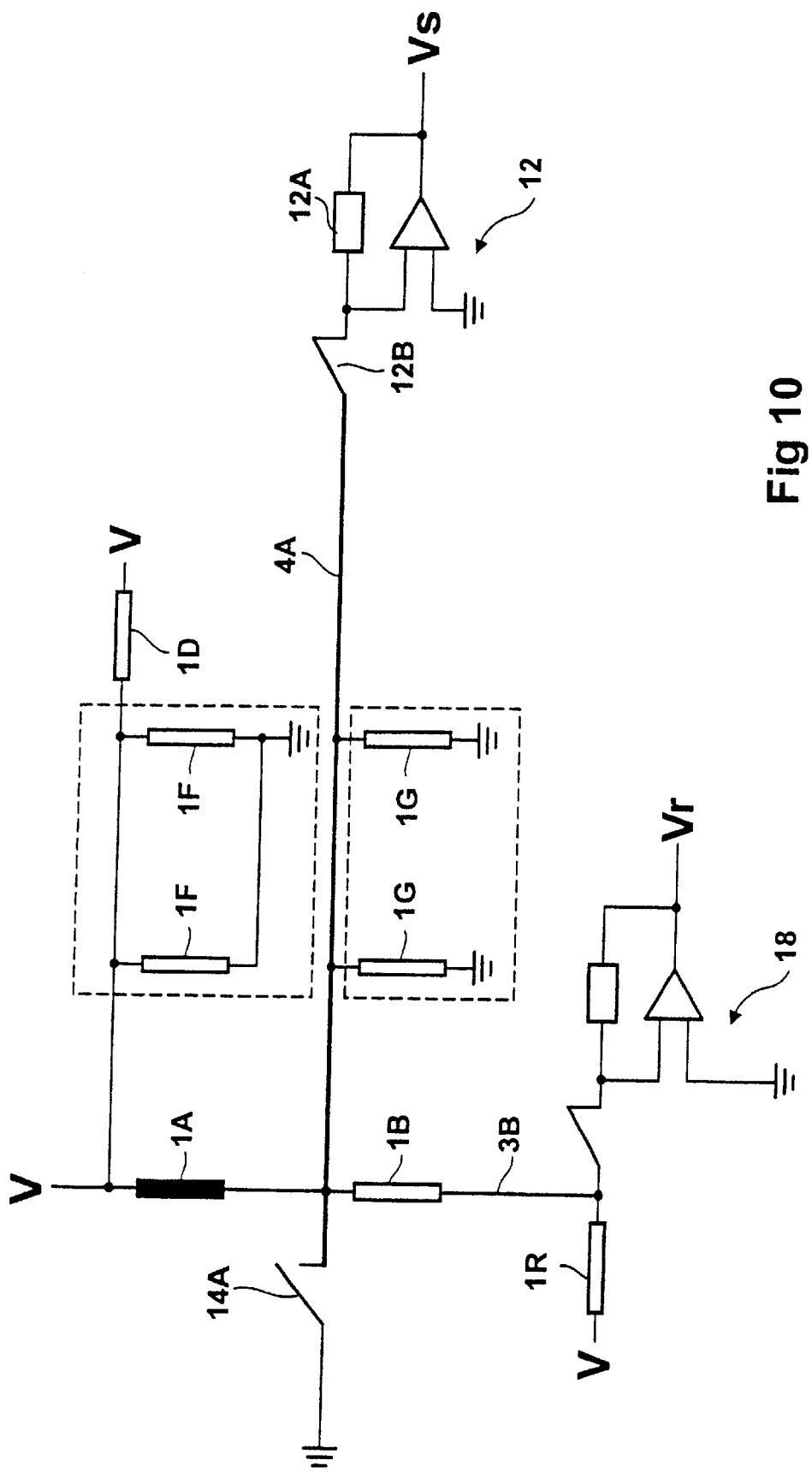
FIG. 10 is a circuit diagram of the elements of significance to forming the signal, with the assistance of the reference element.

FIG. 10 shows a simplified diagrammatic circuit diagram of the significant parasitic elements, the sense lines 4 and the word lines 3 that are not needed are grounded via the grounding switches 14. The parasitic impedances 1F occur (N–2) times (only two shown in FIG. 10) and the parasitic impedances 1G occur (M–2) times (only two shown in FIG. 10) as a parallel circuit. As already mentioned, the memory cell 1D connected to the read voltage V in both directions does not contribute anything to the signal. Similarly, the memory cell 1B virtually grounded in both directions via the inputs of the reference amplifier circuit 18 and of the sense line amplifier circuit 12 does not contribute anything. The circuit shows that the reference signal Vr is almost completely dependent on the impedance of the reference element 1R.

A static measurement without involving the magnetic reference layer 5 in which the two signals of the memory cell 1A and of the reference cell 1R are compared has the disadvantage that, if the directions of magnetization of the information carrier layer 7, that is to say the memory states, of the memory cells are equal, no decision can be made whether the two cells are carrying a logical one or zero.

In the case of a dynamic measurement, the memory contents of the memory cell and/or of the reference cell are overwritten after a first measurement of the (initial) measurement signal Vm in order to reach a defined state and the (final) measurement signal Vm is acquired in a second measurement. The memory state is then reproduced by the following table:

| Memory cell 1A data contents | Reference cell 1R data contents | Measurement signal VM (initial) | Measurement signal Vm (final) |
|---|---|---|---|
| 0 | 0 | 0 | +1 |
| 1 | 0 | +1 | +1 |
| 0 | 1 | −1 | 0 |
| 1 | 1 | 0 | 0 |

If the signal change ΔVm is included in the signal evaluation, only signals with a positive sign (Vm (final) and ΔVm in the following table) are obtained and no signal determination with sign determination is required before the memory cell and/or reference cell is remagnetized which leads to slightly faster read processes.

| Memory cell 1A data contents | Reference cell 1R data contents | Measurement signal VM (initial) | Measurement Signal VM (final) | Signal change ΔVm (ΔVs) |
|---|---|---|---|---|
| 0 | 0 | 0 | +1 | +1 |
| 1 | 0 | +1 | +1 | 0 |
| 0 | 1 | −1 | 0 | +1 |
| 1 | 1 | 0 | 0 | 0 |

The disadvantageous factor is the necessity of successive determination of the states of the memory elements.

After having determined the memory state of a memory cell and of a reference cell, the signal Vr of which was required for determining the memory contents, e.g. in accordance with the manner described above, each further read process can take place using these information items for the comparison by storing the signal Vr and including the known memory state of the reference cell. If the homogeneity of the memory chip permits, a single determination of the reference signal Vs and of the memory state of the reference cell may even be sufficient for all further read processes which corresponds to a fast static read.

Even when the information of the memory cell 1A and of the reference cell 1R is identical, a determination can take place with the aid of the magnetic reference layer 5 without having to pick up the measurement signal Vm before and after a remagnetization.

In such a dynamic measurement, the magnetic reference layer 5, which is magnetically much softer than the information carrier layer 7, of the reference cell 1R is switched by conducting a sense line current Ir through the sense line 4B of the reference cell 1R. In this process, the direction of magnetization of the magnetic reference layer 5 becomes aligned perpendicularly to the direction of magnetization of the information carrier layer 7 of the reference cell 1R and perpendicularly to the sense line current Ir conducted through the sense line 4B. The impedance of the reference cell 1R is thus independent of the stored information in reference cell 1R and thus reflects the electrical and magnetic characteristics, respectively, of the memory cell(s) 1 independently of the information stored in the reference cell, and the sign of Vm unambiguously determines the information content of the memory cell 1A to be read out. It is here assumed that the directions of magnetization of the information carrier layers extend in parallel with the sense lines but it is also conceivable that they extend perpendicular to the sense lines but then the "switching field" of the magnetic reference layers must be built up through the word lines for programming the memory cell.

As a result of this procedure, the memory cell does not need to be rewritten, or brought into a defined state, after determining the memory state which saves a lot of time.

Figure 11:
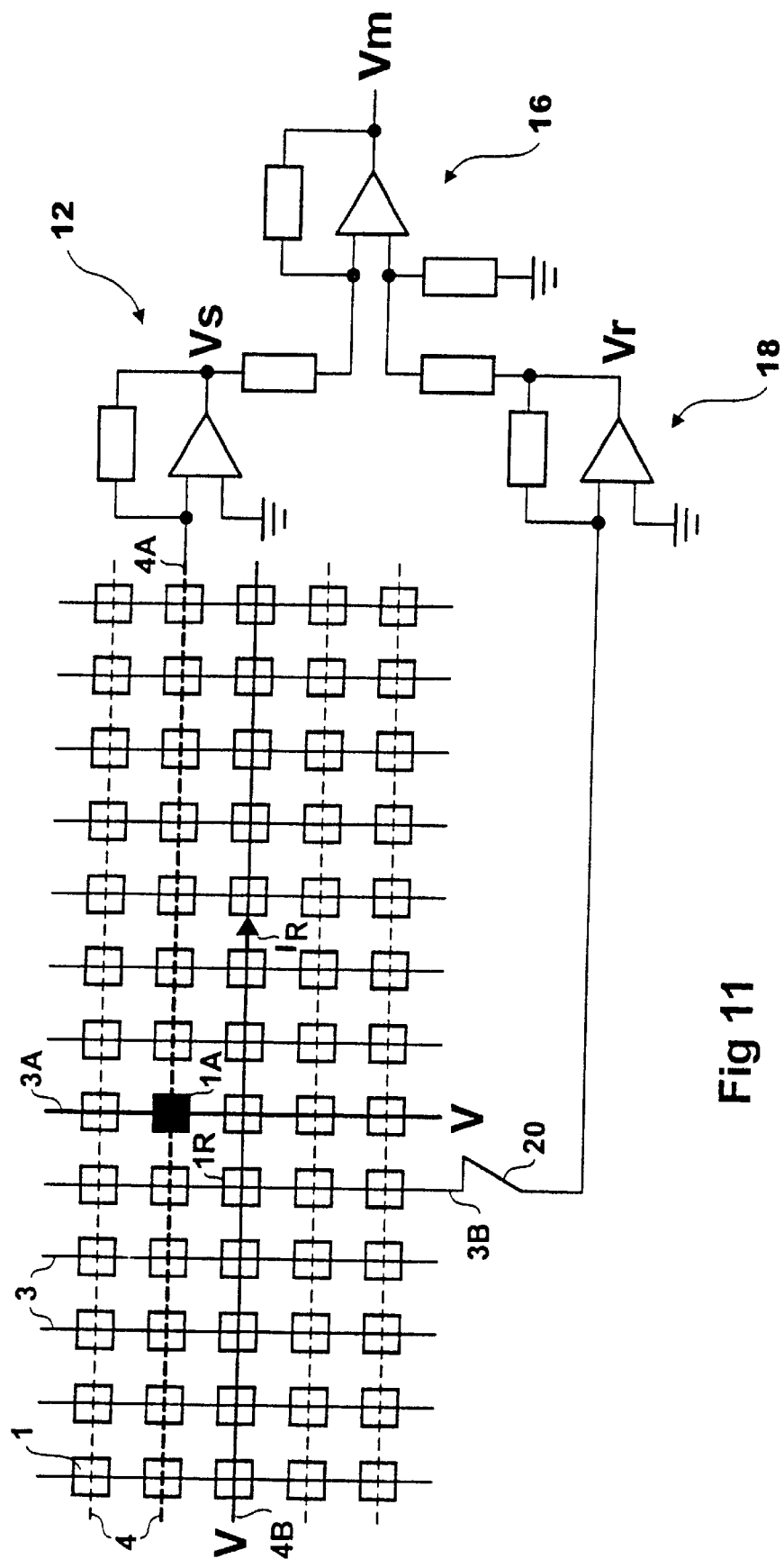
FIG. 11 is a circuit diagram of the magnetic memory with the evaluation circuit containing the reference element within the memory cell array with acquisition of the reference signal via the word line connected to a switch.

FIG. 11 shows the sense line current Ir conducted through the sense line 4B of the reference cell 1R for clarification. In the example shown, the reference amplifier circuit 18 is provided once and the respective word line 3 of the reference cell 1R is connected to the reference amplifier circuit 18 through activation switches 20.

Figure 12:
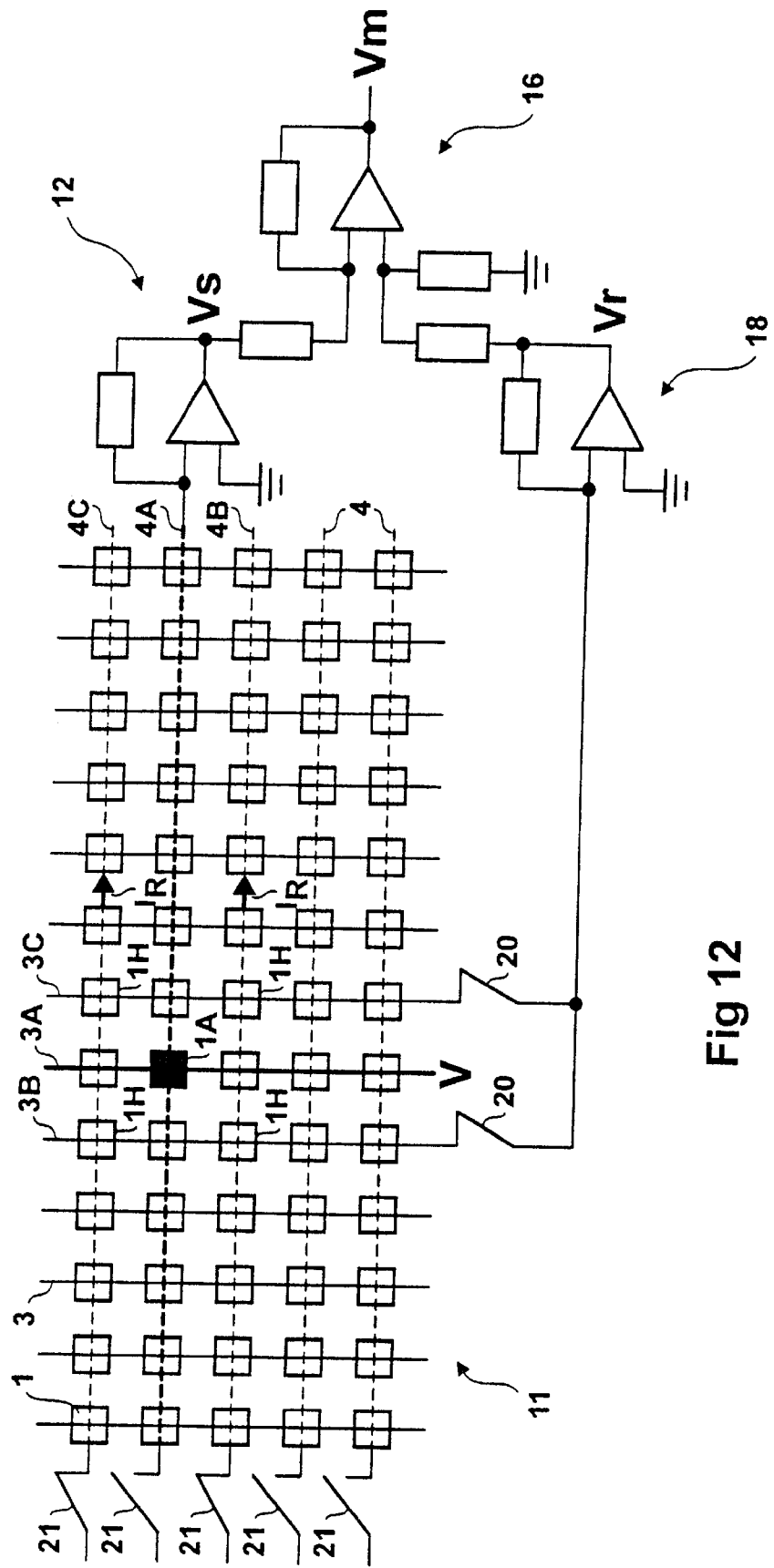
FIG. 12 is a circuit diagram of the magnetic memory with the evaluation circuit and a number of reference elements within the memory cell array with acquisition of the reference signal via word lines.

FIG. 12 shows a further embodiment of the invention. In the application shown, several signals from different reference cells 1H are averaged for compensating for strong lateral gradients in the impedance of the memory cells 1 within the memory cell array 11. The sense line current Ir is applied via the sense lines 4B and 4C through sense line current switches 21 to the reference cells 1H disposed symmetrically and adjacently to the memory cell 1A to be read out, whereupon the magnetic reference layers 5 of the reference cells 1H are brought into the neutral direction of magnetization. The signals of the reference cells 1H, four in this example, are supplied to the reference amplifier circuit 18 via activation switches 20 from word lines 3B and 3C. The reference amplifier circuit 18 is matched in such a manner that the reference signal Vr is at the correct level.

I claim:

1. A random access type magnetic memory (MRAM), comprising:
    word lines;
    sense lines;
    a memory cell array containing a multiplicity of memory cells disposed in a matrix at points of intersection of said word lines and said sense lines and having logical data contents being defined by a magnetic state;
    an addressing circuit connected to said word lines for applying a read voltage to a word line of a selected memory cell in which the logical data contents are to be read out as a sense signal on one of said sense lines;

a reference element outputting a reference signal; and an evaluation circuit connected to said sense lines and having a comparator circuit receiving the sense signal and the reference signal supplied by said reference element and compares the reference signal with the sense signal generated from said selected memory cell being read out.

2. The magnetic memory according to claim 1, including switches connected to said word lines and said sense lines for individually connecting said word lines and said sense lines to ground.

3. The magnetic memory according to claim 1, wherein said reference element is a reference cell in said memory cell array, and said selected memory cell and said reference cell are virtually grounded at least at one end.

4. The magnetic memory according to claim 1, wherein said comparator circuit outputs a difference signal formed from a difference of the sense signal and the reference signal.

5. The magnetic memory according to claim 1, wherein said multiplicity of memory cells have electrical and magnetic characteristics, and said reference element has electrical and magnetic characteristics that are matched to said electrical and magnetic characteristics, respectively, of said multiplicity of memory cells.

6. The magnetic memory according to claim 5, wherein said reference element is disposed outside of said memory cell array and said electrical and magnetic characteristics of said reference element are variably adjustable.

7. The magnetic memory according to claim 1, including a reference amplifier connected to said reference element.

8. The magnetic memory according to claim 1, wherein said memory cell array is divided into a number of different cell areas of contiguous memory cells having substantially similar electrical and magnetic characteristics, and one of a matching reference signal and a separate reference element is allocated to each of said different cell areas.

9. The magnetic memory according to claim 1, wherein said reference element is a reference cell being a memory cell of said memory cell array.

10. The magnetic memory according to claim 9, including a reference amplifier circuit, and the reference signal of said reference cell is received by said reference amplifier circuit via one of said sense lines.

11. The magnetic memory according to claim 9, wherein said reference element is disposed on one of adjacent word lines and adjacent sense lines of said selected memory cell to be read out.

12. The magnetic memory according to claim 9, including a reference amplifier circuit, and a word line of said word lines is connected to both said reference cell and said reference amplifier circuit.

13. The magnetic memory according to claim 12, wherein said reference cell is a plurality of reference cells disposed adjacently to said selected memory cell to be read out.

14. The magnetic memory according to claim 13, wherein said plurality of reference cells are jointly connected to said reference amplifier circuit.

15. The magnetic memory according to claim 13, wherein different voltage levels are applied to said selected memory cell to be read out and said plurality of reference cells.

16. The magnetic memory according to claim 1, wherein said comparator circuit includes a differential amplifier having inputs and an output and a resistor having a first end connected to one of said inputs and a second end connected to said output of said differential amplifier, said comparator circuit having further resistors connected in series with said inputs of said differential amplifier.

17. The magnetic memory according to claim 16, including:

a reference amplifier circuit connected in series with said comparator circuit and to said reference element for processing the reference signal of said reference element; and a sense line amplifier circuit disposed in series with said comparator circuit and connected to said sense lines, said sense line amplifier circuit processes the sense signal of said selected memory cell.

18. The magnetic memory cell according to claim 1, wherein said selected memory cell to be read out is one of a plurality of memory cells to be read out.

19. A magnetic memory cell, comprising:

a substrate;

sense lines disposed on said substrate;

a first magnetic material layer disposed on said sense lines, said first magnetic material layer being an information carrier layer;

a magnetic tunnel barrier layer disposed on said first magnetic material layer;

a second magnetic material layer disposed on said magnetic tunnel barrier, said second magnetic material layer being a magnetic reference layer; and word lines disposed on said second magnetic material layer and crossing said sense lines.

20. The magnetic memory cell according to claim 19, wherein said second magnetic material layer is magnetically softer than said first magnetic material layer.

21. A magnetic memory cell, comprising:

sense lines;

a plurality of layer sequences each formed of a magnetic layer of a first type, a decoupling layer, a magnetic layer of a second type, and a further decoupling layer, said plurality of layer sequences disposed on said sense lines, and said magnetic layer of said first type forming a magnetic reference layer and said magnetic layer of said second type forming an information carrier layer; and word lines disposed on said plurality of layer sequences and crossing said sense lines.

22. The magnetic memory cell according to claim 21, wherein said magnetic layer of said first type is magnetically softer than said magnetic layer of said second type.

23. A method for reading out a random access type magnetic memory (MRAM) having word lines, sense lines, and a memory cell array containing a multiplicity of memory cells disposed in a matrix at points of intersection of the word lines and the sense lines and the multiplicity of memory cells contain logical data contents defined by a magnetic state, the random access type magnetic memory further having an addressing circuit allocated to the word lines, the method which comprises:

applying a read voltage to a word line of a selected memory cell for reading out the logical data contents;

acquiring and evaluating a sense signal corresponding to the logical data contents of the selected memory cell in an evaluation circuit connected to the sense lines; and providing a reference signal generated by a reference element to the evaluation circuit which compares the sense signal with the reference signal.

24. The method according to claim 23, which comprises storing the reference signal of the reference element resulting in a stored reference signal, the stored reference signal is compared with the sense signal of the selected memory cell to be read out for a comparison in further determinations of memory contents of the multiplicity of memory cells.

25. The method according claim 23, which comprises evaluating sense signals of a plurality of reference elements that are disposed adjacently to the selected memory cell to be read out.

26. The method according to claim 25, which comprises evaluating the sense signals of the plurality of reference elements jointly using a reference amplifier circuit.

27. The method according to claim 25, which comprises applying different voltage levels to the selected memory cell to be read out and to the plurality of reference cells.

28. The method according to claim 23, which comprises:
   forming the multiplicity of memory cells as a sequence of layers including a magnetic reference layer, a tunnel barrier layer, and an information carrier layer; and
   using at least one of the multiplicity of memory cells as the reference element, the reference element having a direction of magnetization of the magnetic reference layer directed perpendicularly to a direction of magnetization of the information carrier layer during a comparison of the reference signal with the sense signal.

29. The method according to claim 23, which comprises:
   forming the multiplicity of memory cells from a plurality of layered sequences disposed one above the other and each including a magnetic reference layer, a decoupling layer, an information carrier layer and a further decoupling layer; and
   using at least one of the multiplicity of memory cells as the reference element, the reference element having a direction of magnetization of the magnetic reference layer directed perpendicularly to a direction of magnetization of the information carrier layer during a comparison of the reference signal with the sense signal.

* * * * *